(12) United States Patent
Chow et al.

(10) Patent No.: US 6,401,728 B2
(45) Date of Patent: Jun. 11, 2002

(54) METHOD FOR CLEANING INTERIOR OF ETCHING CHAMBER

(75) Inventors: Yu-Chang Chow, Hsinchu; W. H. Cheng, Chu-Pei; Chia-Fu Yeh, Taipei; C. M. Chi, Taichung Hsien; Cobby Lee, Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/286,008

(22) Filed: Apr. 5, 1999

(30) Foreign Application Priority Data

Mar. 1, 1999 (TW) .......................................... 88103039

(51) Int. Cl.$^7$ .............................. B08B 7/00; B08B 9/00; H01L 21/302
(52) U.S. Cl. ..................... 134/1.1; 134/22.1; 438/905; 156/345
(58) Field of Search ................ 134/1.1, 1.2, 22.1; 438/905; 156/395

(56) References Cited

U.S. PATENT DOCUMENTS

| | | | | |
|---|---|---|---|---|
| 5,207,836 A | * | 5/1993 | Chang | 134/1.1 |
| 5,356,478 A | * | 10/1994 | Chen et al. | 134/1 |
| 5,817,578 A | * | 10/1998 | Ogawa | 134/1.1 |
| 5,843,239 A | * | 12/1998 | Shrotriya | 134/1.1 |
| 5,968,278 A | * | 10/1999 | Young et al. | 134/1.1 |
| 6,060,397 A | * | 5/2000 | Seamons et al. | 134/1.1 |
| 6,090,718 A | * | 7/2000 | Soga et al. | 134/1.1 |

\* cited by examiner

Primary Examiner—Frankie L. Stinson
Assistant Examiner—Saed Chaudhry
(74) Attorney, Agent, or Firm—J.C. Patents

(57) ABSTRACT

A process for cleaning the interior walls of a reaction chamber after a number of silicon wafers is etched inside the chamber. The cleaning process includes bombarding the interior walls of the chamber with a first type of plasma in a dry cleaning operation, and then bombarding the interior walls of the chamber with a second type of plasma containing the element hydrogen in a warm-up operation. No silicon wafers need to be placed inside the chamber when the dry cleaning operation or the warm-up operation is conducted.

17 Claims, 1 Drawing Sheet

METHOD FOR CLEANING INTERIOR OF ETCHING CHAMBER

CROSS-REFERENCE TO RELATED APPLICATION

This application claims the priority benefit of Taiwan application Ser. No. 88103039, filed Mar. 1, 1999, the full disclosure of which is incorporated herein by reference.

BACKGROUND OF THE INVENTION

1. Field of Invention

The present invention relates to a method for cleaning the interior of an etching chamber. More particularly, the present invention relates to a method for cleaning the interior walls of an etching chamber with plasma.

2. Description of Related Art

In the manufacture of semiconductor products, most gate conductive layers of a MOS transistor are composed of a doped polysilicon layer and a metallic silicide layer. The metallic silicide layer/is probably a tungsten silicide ($WSi_x$) layer. In general, the transistor gate structure is formed by first depositing a polysilicon layer and then a metal silicide layer over a substrate. Next, a photoresist layer is deposited and then patterned using a photolithographic method. Finally, the metal silicide layer and the polysilicon layer are sequentially etched using an anisotropic plasma etching method to form a gate structure.

An anisotropic plasma etching operation is a process in which highly energetic particles within the plasma are deployed to bombard tungsten silicide and polysilicon of the conductive layer. Therefore, some reaction products are deposited on the interior walls of the reaction chamber and gradually accumulate. These reaction products, composing mainly micro-particles or high molecular weight compounds, may drop back onto the surface of the silicon wafer when the wafer is undergoing an etching operation. Often, this may lead to the deviation of critical dimensions for some of the devices on the wafer.

In consequence, after the reaction chamber has been used for a number of times or the etching station has been left idle for more than an hour, a dry cleaning process needs to be carried out. The dry cleaning process tries to remove any deposited reaction products attached to the interior walls of the chamber, thereby maintaining a rather constant reaction environment inside the chamber and reducing product yield problems.

A dry cleaning process actually comprises a dry cleaning operation and a warm-up operation. Conventionally, the dry cleaning operation requires the execution of an etching operation inside the reaction chamber for about 500 RFmin. In other words, the process includes powering up at normal working radio frequency (RF) range for about 500 minutes with three silicon wafers inside the reaction chamber. Next, a mixture of gases including chlorine ($Cl_2$) and carbon hexafluoride ($CF_6$) are passed into the chamber to form a plasma that can be used to bombard the interior walls of the reaction chamber. The bombarding operation lasts for another 5 RFmin. Hence, most of the reaction products deposited on the interior walls of the reaction chamber are removed.

Since most reaction products deposited on the interior walls of the reaction chamber are removed during the dry cleaning phase, the environment inside the reaction chamber with respect to wafer etching may change suddenly. Great changes in the etching environment may lead to instability when etching a conductive layer. In order to obtain a more stable wafer quality, a warm-up operation is necessary to stabilize the reaction environment inside the chamber.

In a conventional warm-up operation, a dummy wafer is placed inside the chamber and then a reaction condition similar to a normal etching operation is applied. Since etching a conductive layer actually includes etching a photoresist layer, a tungsten silicide layer and a polysilicon layer, the warm-up operation must includes several steps. Firstly, a gaseous mixture of oxygen, hydrogen and hydrogen bromide (HBr) is passed into the chamber to form a plasma, and then the dummy wafer is bombarded using the plasma for about 90 seconds. Next, a gaseous mixture of chlorine and hydrogen bromide is passed into the chamber to form another plasma, and then the dummy wafer is again bombarded by the plasma for about 140 seconds. Finally, a gaseous mixture containing hydrogen bromide, helium and helium dioxide ($HeO_2$) is passed into the chamber to form yet another plasma, and then the dummy wafer is bombarded with the plasma for about 100 seconds. The warm-up operation requires altogether some 3 to 10 dummy wafers. After the warm-up operation, a more stable etching environment is obtained.

However, in the aforementioned method of cleaning the reaction chamber, fluoride-containing (F) gaseous mixture is used as a plasma source. Therefore, a considerable amount of fluorine radicals is attached to the interior walls of the reaction chamber. When metal silicide or polysilicon layers are being etched, these fluorine radicals can react with the chlorine and hydrogen bromide in the plasma. Consequently, uniformity of wafer surface may worsen and the etching rate may be reduced, leading to larger deviations in the critical dimensions of some devices. In some cases, even an etching selectivity ratio between polysilicon and oxide may be affected. If the etching selectivity ratio changes, it is rather difficult to determine the etching end point when polysilicon is etched. Moreover, the plasma used for etching the polysilicon layer may etch into the gate oxide layer between the gate conductive layer and the substrate. Since the gate oxide layer is already a very thin layer of about 80 Å, any further reduction of the gate oxide layer down to a thickness of about 40 Å or lower by etching leads to serious problems such as the pitting of the active area of a device.

The amount of fluoride radicals on the interior wall of the chamber is reduced gradually as the number of etching operations being conducted increases, and hence the etching environment recovers only after a while. Therefore, etch quality of the first few silicon wafers immediately after the dry cleaning process may not be too stable, but improves considerably due to the stabilization of the chamber environment later on. The phenomenon of the first batch of a few silicon wafers having a poorer quality than subsequent batches is called the first wafer effect or memory effect.

Furthermore, several pieces of silicon wafers and dummy wafers are wasted during the dry cleaning operation as well as the warm-up operation. Moreover, a wet cleaning operation needs to be carried out after every 8000 RFmin of etching operation despite the performance of dry cleaning processes from time to time. Hence, functional time of the reaction chamber is short and wafer productivity is low.

In light of the foregoing, there is a need to provide a better method of cleaning the reaction chamber.

SUMMARY OF THE INVENTION

Accordingly, the present invention provides a method for clearing away reaction products accumulated on the interior walls of an etching chamber after a number of etching operations so that stable etching operations can be resumed.

To achieve these and other advantages and in accordance with the invention, as embodied and broadly described herein, the invention provides a method for cleaning a silicon wafers etching chamber. The method includes performing a dry cleaning operation followed by a warm-up operation. In the dry cleaning operation, a gaseous mixture containing chlorine, oxygen and carbon hexafluoride is passed into the reaction chamber to form a first type of plasma. Next, the plasma is made to bombard against the interior walls of the reaction chamber. In the warm-up operation, a gaseous mixture containing the element hydrogen is passed into the reaction chamber to form a second type of plasma. Then, the plasma is again made to bombard against the interior walls of the reaction chamber so that fluoride free radicals inside the reaction chamber are removed. Ultimately, the etching environment within the etching chamber returns to normal.

The dry cleaning process according to this invention does not require the use of any silicon wafer. The dry cleaning process includes a dry cleaning operation and a warm-up operation. Hence, the method is capable not only of reducing first silicon effect and providing a stable etching environment inside the chamber, but also capable of minimizing silicon wafer wastes. In the dry cleaning process, only two types of plasmas are used, thereby having fewer steps and a shorter cleaning period. Furthermore, the reaction chamber can be used to etch silicon wafers for a longer period before cleaning is necessary. Hence, there is considerable increase in productivity.

It is to be understood that both the foregoing general description and the following detailed description are exemplary, and are intended to provide further explanation of the invention as claimed.

BRIEF DESCRIPTION OF THE DRAWINGS

The accompanying drawing is included to provide a further understanding of the invention, and are incorporated in and constitute a part of this specification. The drawing illustrates embodiments of the invention and, together with the description, serves to explain the principles of the invention. In the drawing.

DESCRIPTION OF THE PREFERRED EMBODIMENTS

Figure 1:
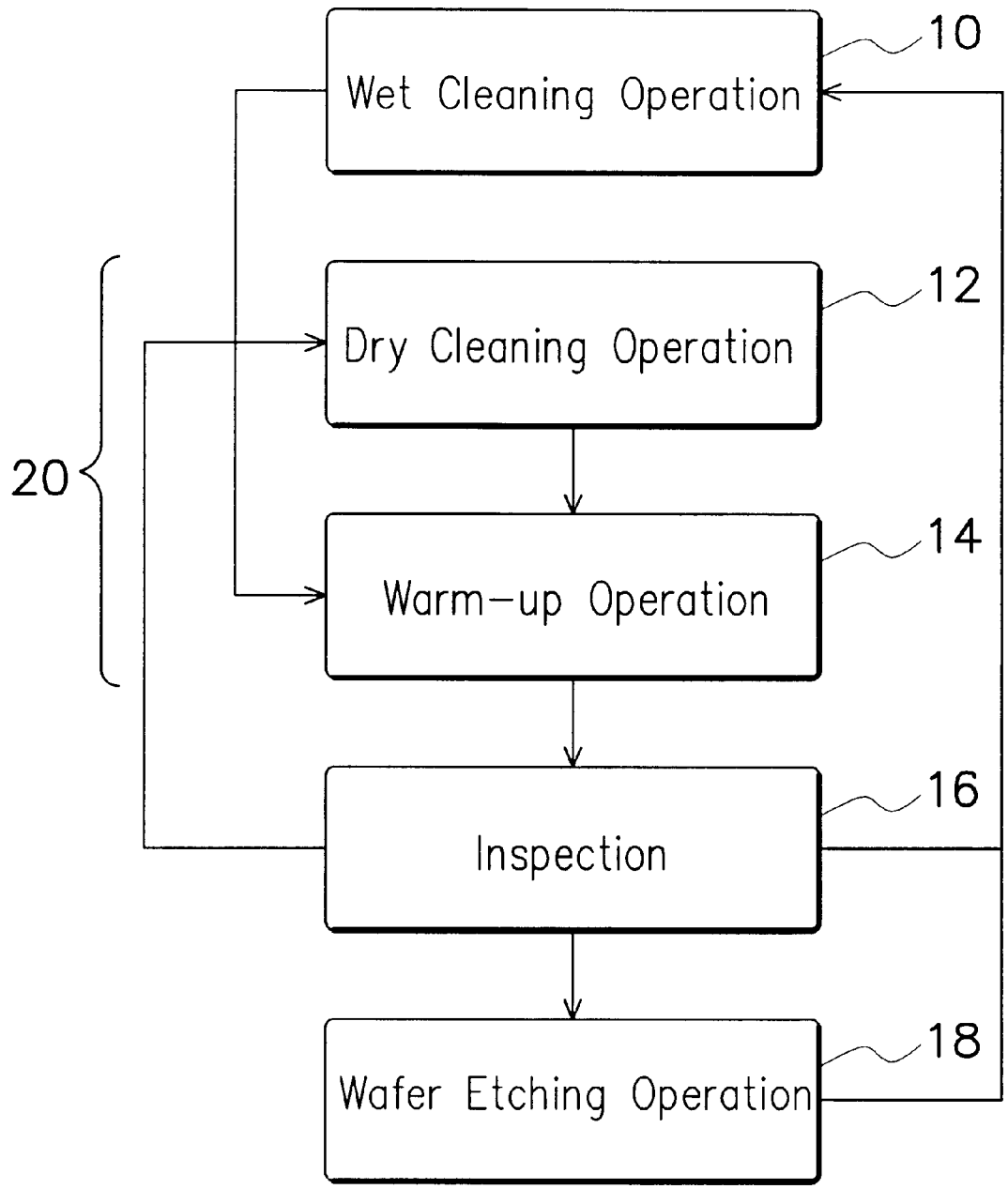
FIG. 1 is a flow chart showing the steps involved in cleaning the etching chamber according to this invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flow chart showing the steps involved in cleaning the etching chamber according to this invention.

If an etching machine is left in idle for more than an hour or some 1 to 30 silicon wafers have passed through an etching operation 18, an environment inside the etching chamber may have changed considerably. If the etching operation is permitted to continue, problems related to etching quality may arise. In other words, the etching rate may be difficult to control, resulting threshold dimensions may be out of range and the etching end point may be hard to determine. Therefore, a dry cleaning process that includes a dry cleaning operation 12 and a warm-up operation 14 need to be conducted.

First, in a dry cleaning operation 12, a first type of plasma is produced inside the chamber for bombarding against the interior walls. The first type of plasma is formed by introducing gaseous chlorine at a flow rate of about 20 sccm, gaseous oxygen at a flow rate of about 50 sccm and gaseous carbon hexafluoride at a flow rate of about 100 sccm. The plasma is at a pressure of about 10 mT and a power of about 800W. The bombardment of interior walls of the etching chamber continues for about 70 seconds. Note that there is no need to place silicon wafers inside the reaction chamber when the dry cleaning operation 12 is performed.

Since the gaseous mixture used in the dry cleaning operation 12 contains the element fluorine, some fluoride radicals accumulate on the interior walls of the chamber. These fluoride radicals may react with gaseous chlorine and hydrogen bromide in the plasma when polysilicon or metal silicide layer is etched, thereby affecting surface uniformity, etching rate and etching selectivity ratio between polysilicon and oxide material. Furthermore, the amount of fluoride radicals diminishes as more etching operations are conducted, thereby leading to what is known as the first wafer effect. To remove the fluoride radicals, a warm-up operation 14 is conducted next.

In a warm-up operation 14, a second type of plasma is produced inside the chamber for bombarding against the interior walls. The second type of plasma is formed by introducing gaseous chlorine at a flow rate of about 50 sccm and gaseous hydrogen bromide at a flow rate of about 50 sccm. The plasma is at a pressure of about 15 mT and a power of about 800W. The bombardment of the interior walls of the etching chamber continues for about 60 seconds. In addition, the second type of plasma may also be formed by introducing gaseous hydrogen at a flow rate of about 50 sccm to 150 sccm. The plasma has a pressure of between 10 mT to 100 mT and a power of between 500W to 800W. The bombardment of interior walls of the etching chamber continues for about 60 to 300 seconds. Note that there is no need to place silicon wafers inside the reaction chamber when the warm-up operation 14 is performed.

The element hydrogen in the gaseous source used in forming the second plasma for the warm-up operation 14 can react with the fluoride free radicals. Hence, the harmful effects of fluoride radicals in subsequent etching operations are greatly reduced.

To ensure stability of etching operations inside the reaction chamber, an inspection 16 of the cleaning process is conducted immediately after the warm-up operation 14. If the results meet the normal operation standard with respect to the etching rate, the quantity of micro-particles and surface uniformity of etched silicon wafers, normal etching operations 18 can resume. On the contrary, if the conditions inside the reaction chamber are unsatisfactory, for example, the number of micro-particles having a diameter more than 0.02 micro-meter are more than 30, another dry cleaning process needs to be carried out. In other words, the dry cleaning operation 12, the warm-up operation 14 and the inspection operation 16 have to be repeated again. However, if after repeating the dry cleaning operation 12, the warm-up operation 14 and the inspection operation 16, the results are still not up to standard, another round of dry cleaning operation 12, warm-up operation 14 and inspection operation 16 can be conducted. After performing the dry cleaning process 20 twice, if there is still no marked improvement in the etching conditions of the etching operation, a wet cleaning operation 10 needs to be conducted.

In addition, after etching one to 30 silicon wafers inside an etching chamber, a dry cleaning operation 12 followed by a warm-up operation 14 are conducted. The wafer etching operations together with the cleaning operation 12 and the warm-up operation 14 can be considered one operating cycle for the reaction chamber. After going through some 10 to 20 operating cycles, a dry cleaning operation 12 and a warm-up operation alone may no longer be able to remove the deposited reaction products accumulated through many operating cycles. To resume the original etching state or to act just as a preventive maintenance measure, a wet cleaning operation 10 is then carried out.

To perform a wet cleaning operation, the entire etching machine has to be shut down. The etching chamber has to be opened up so that various components can be taken apart for manual cleaning. Any reaction products deposited on the interior walls of the chamber can be brushed away using chemical agents. Consequently, a wet cleaning operation is quite time-consuming and labor intensive. However, using the cleaning method of this invention, the operable period between two wet cleaning operations is lengthened to over 30000 RFmin.

In summary, the cleaning method of this invention is able to remove reaction products attached to the interior walls of a reaction chamber without having to place silicon wafers into the chamber, thereby saving some wafers. Furthermore, the method is able to reconstitute a stable etching environment inside the chamber without the first wafer effect. Moreover, suitable etching conditions are maintained longer after each cleaning process than the conventional method. Hence, more silicon wafers can be etched inside the chamber, thereby increasing the productivity of wafers.

It will be apparent to those skilled in the art that various modifications and variations can be made to the structure of the present invention without departing from the scope or spirit of the invention, In view of the foregoing, it is intended that the present invention cover modifications and variations of this invention provided they fall within the scope of the following claims and their equivalents.

What is claimed is:

1. A method for cleaning a reaction chamber of a silicon wafer etcher, comprising steps of:
    performing a dry cleaning operation, during which no silicon wafers are placed inside the reaction chamber, by bombarding interior walls of the reaction chamber with a first plasma, wherein the first plasma contains gaseous chlorine, gaseous oxygen and gaseous carbon hexafluoride; and
    performing a warm-up operation, during which no silicon wafers are placed inside the reaction chamber, by bombarding the interior walls of the reaction chamber with a second plasma, wherein the second plasma includes a gaseous mixture that contains chlorine and hydrogen bromide.

2. The method of claim 1, wherein a flow rate of gaseous chlorine is about 20 sccm, a flow rate of gaseous oxygen is about 50 sccm, a flow rate of gaseous carbon hexafluoride is about 100 sccm and the first plasma has a pressure of 10 mT at a power of about 800W.

3. The method of claim 2, wherein the dry cleaning operation is carried out for a period of about 70 seconds.

4. The method of claim 1, wherein the second plasma includes chlorine having a flow rate of about 50 sccm and hydrogen bromide having a flow rate of about 50 sccm, and the second plasma is at a pressure of about 15 mT and a power of about 800W.

5. The method of claim 4, wherein the warm-up operation is carried out for a period of about 60 seconds.

6. The method of claim 1, wherein the second plasma further includes gaseous hydrogen with a flow rate of about 50 sccm to 150 sccm, and the second plasma is at a pressure of between 10 mT to 100 mT and a power of between 500W to 800W.

7. The method of claim 6, wherein the warm-up operation is carried out for a period of between 60 to 300 seconds.

8. A process for cleaning an interior of a wafer etching chamber after a number of wafer etching operations, comprising steps of:
    bombarding the interior walls of the chamber with a first plasma that contains a mixture of gaseous chlorine, gaseous oxygen and gaseous carbon hexafluoride, whereinno silicon wafers are placed inside the wafer etching chamber during the bombardment; and
    bombarding the interior walls of the chamber with a second plasma that contains a gaseous source including chlorine and hydrogen bromide, wherein no silicon wafers are placed inside the wafer etching chamber during the bombardment.

9. The process of claim 8, wherein after the step of bombarding the interior walls of the chamber with the second plasma, further includes performing an inspection.

10. The process of claim 8, wherein after performing a plurality of the cleaning operations, further includes performing a wet cleaning operation.

11. The process of claim 8, wherein the first plasma includes gaseous chlorine at a flow rate of about 20 sccm, gaseous oxygen at a flow rate of about 50 sccm, and gaseous carbon hexafluoride at a flow rate of about 100 sccm, and the first plasma is at a pressure of about 10 mT and a power of about 800W.

12. The process of claim 11, wherein the step of bombarding the interior walls of the chamber with the first plasma continues for a period of about 70 seconds.

13. The process of claim 8, wherein the second plasma includes gaseous chlorine with a flow rate of about 50 sccm and gaseous hydrogen bromide with a flow rate of about 50 sccm, and the second plasma is at a pressure of about 15 mT and a power of about 800W.

14. The process of claim 13, wherein the step of bombarding the interior walls of the chamber with the second plasma continues for a period of about 60 seconds.

15. The process of claim 8, wherein the second plasma further includes gaseous hydrogen with a flow rate of about 50 sccm to 150 sccm, and the second plasma is at a pressure of between 10 mT to 100 mT and a power of between 500W to 800W.

16. The process of claim 15, wherein the step of bombarding the interior walls of the chamber with the second plasma continues for a period of about 60 to 300 seconds.

17. The process of claim 8, wherein the cleaning operation is conducted once after roughly one to 30 silicon wafers are etched inside the chamber.

* * * * *